United States Patent [19]

Ashley et al.

[11] Patent Number: 4,966,812
[45] Date of Patent: Oct. 30, 1990

[54] SOL-GEL ANTIREFLECTIVE COATING ON PLASTICS

[75] Inventors: Carol S. Ashley; Scott T. Reed, both of Albuquerque, N. Mex.

[73] Assignee: The United States of America as represented by the Department of Energy, Washington, D.C.

[21] Appl. No.: 359,458

[22] Filed: Jun. 1, 1989

Related U.S. Application Data

[62] Division of Ser. No. 148,458, Jan. 26, 1988, abandoned.

[51] Int. Cl.$^5$ ............................................. B32B 27/36
[52] U.S. Cl. ................................. 428/412; 427/161; 427/162; 427/163; 427/464; 427/467; 427/469; 428/447; 428/469
[58] Field of Search ............ 428/412, 447, 469; 427/387, 421, 430.1, 424, 161, 162, 163, 464, 467, 469

[56] References Cited

U.S. PATENT DOCUMENTS

| | | | |
|---|---|---|---|
| 2,466,119 | 4/1949 | Moulton et al. | 88/1 |
| 3,996,068 | 12/1976 | Urry | 429/101 |
| 4,273,826 | 6/1981 | McCollister et al. | 428/304 |
| 4,286,024 | 8/1981 | Yoldas | 428/446 |
| 4,361,598 | 11/1982 | Yoldas | 427/74 |
| 4,397,666 | 8/1983 | Mishima et al. | 65/18.3 |
| 4,476,156 | 10/1984 | Brinker et al. | 427/82 |
| 4,535,026 | 8/1985 | Yoldas et al. | 428/310.5 |
| 4,652,467 | 3/1987 | Brinker et al. | 427/246 |
| 4,710,227 | 1/1987 | Harley et al. | 106/193 R |
| 4,731,264 | 3/1988 | Lin et al. | 427/387 |

OTHER PUBLICATIONS

Ashley, C., and Reed, S., "Sol-Gel-Derived AR Coatings for Solar Receivers", *Sandia Report*, SAND-84-0062, (Sep. 1984), pp. 1-34.

Milam, D., "Damage-Resistant Antireflection Surfaces for High-Power Lasers", *Energy and Technology Review*, Lawrence Livermore Laboratory, Livermore, Calif., pp. 9-17 (Mar. 1982).

Lind, M., Pettit, R., Masterson, K., "The Sensitivity of Solar Transmittance, Reflectance and Absorptance to Selected Averaging Procedures and Solar Irradiance Distributions", *Journal of Solar Energy Engineering*, vol. 102, pp. 34-40 (Feb. 1980).

Pettit, R., "Hemispherical Transmittance Properties of Solar Glazings as a Function of Averaging Procedure and Incident Angle" *Solar Energy Materials*, vol. 1, pp. 125-140 (1979).

Pettit and Brinker, "Use of Sol-Gel Thin Films in Solar Energy Applications", *Solar Energy Materials*, vol. 14, pp. 268-287 1986.

Ashley and Reed, "Sol-Gel AR Films For Solar Applications", presentation at Better Ceramics Through Chemistry II, Materials Research Society Symposium, Apr. 15-18, 1986, published *Materials Research Society Proceedings*, vol. 73, pp. 671-677, Sep. 1986.

Mahoney, Ashley, and Reed, "Sol-Gel Planarized Flexible Solar Mirrors", SAND87-1578A, Solar Thermal Conference, Albuquerque, N.M. Aug., 26-27, 1987, viewgraphs printed in SAND87-1258, Aug. 1987.

*Primary Examiner*—Edith Buffalow
*Attorney, Agent, or Firm*—Anne D. Daniel; James H. Chafin; William R. Moser

[57] ABSTRACT

An antireflection film made from a reliquified sol-gel hydrolyzation, condensation polymeric reaction product of a silicon, alkoxides and/or metal alkoxides, or mixtures thereof. The film is particularly useful for coating plastics.

14 Claims, 2 Drawing Sheets

SOL-GEL ANTIREFLECTIVE COATING ON PLASTICS

The United States Government has rights in this invention pursuant to Contract No. DE-AC04-76DP00789 between the United States Department of Energy and AT&T Technologies, Inc.

This is a Division of application Ser. No. 148,458 filed Jan. 26, 1988, now abandoned.

BACKGROUND OF THE INVENTION

1. Field of the Invention

The present invention relates to sol-gel antireflective (AR) surface coating solutions and films, and methods for their preparation. Antireflective surface coating films reduce the reflectance of light from a surface (increase light transmittance through the film/substrate interface). More particularly, these sol gel coating films are single layer interference antireflective surfaces comprised of hydrolyzed polymeric metal alkoxides. These antireflective surface coating films are particularly useful for coating various plastic substrates to increase light transmission, without need to subject the film or the substrate to high temperature. Plastic substrates coated with the antireflective surface coating films of the present invention may be used, for example, in solar thermal and solar photovoltaic applications.

2. Discussion of Related Art

In solar applications, materials such as glasses and plastics have been used to minimize thermal losses, concentrate and focus light, and protect absorbers. Plastics, as compared with glasses, are less expensive, more easily formed into complex shapes, lighter in weight and not as brittle. Accordingly, the use of plastics, such as polycarbonates and acrylic polymers, is increasing in solar applications. Both glasses and plastics suffer from reflective losses at the material/air interface, the losses averaging about 7% for two surfaces. While numerous practical approaches to reducing the reflective losses for glass materials have been developed, few techniques are available for antireflecting plastics. Typical applications for plastics include fresnel focusing lenses in both thermal receivers and photovoltaic concentrator systems and glazing for flat plate collectors.

Sandia report SAND 84-0662 describes the development of a process for applying a single layer, antireflective coating to a Pyrex substrate for use in parabolic trough collector envelopes. The process comprises a preliminary step of aging the sol-gel in order to increase the size of the polymer contained in the solution, depositing the sol-gel onto the Pyrex substrate to form a film, heating the deposited film to 500° C. and finally etching the heated film to produce the required refractive index and thickness for a single-layer interference anti-reflecting film on Pyrex for solar thermal applications. Due to the temperature limitation of plastics (maximum approximately 150° C.) and because etching has been found to be ineffective at decreasing the index of an unheated sol-gel film, the process developed for Pyrex was discovered to be unsuitable for obtaining plastics having a low index, sol-gel, antireflective surface coating film deposited thereon.

British Patent No. 1,444,152, British Patent No. 1,530,833 and U.S. Pat. No. 3,996,067 describe standard techniques for depositing an AR film on plastics. The described techniques are vapor deposition, reactive plasma modification and fluorination processes. However, due to the drawbacks associated with these described techniques, none of the techniques have been used in large scale commercial solar applications.

The disadvantages of vapor deposition are: (1) large capital expenditure for deposition equipment, (2) possible temperature build up that can deform or melt the plastic surface, (3) restricted part size and geometry due to equipment limitations, and (4) separate coating processes are required for each surface.

Antireflection surfaces can also be formed by chemical modification of a surface by a reactive plasma. Again, this requires expensive equipment, possible heat build up, and size limitations.

Solutions containing fluorinated organics have been deposited on plastics which then exhibited antireflecting properties. However, fluorination processes appear to be limited to self developing photographic film applications and do not appear to be adaptable for large scale solar applications.

U.S. Pat. No. 2,466,119 to Moulton et al describes methods of depositing highly reflective and antireflective, multilayer films using (1) mixtures of $SiO_2$ and $TiO_2$ solutions, (2) in situ evaporation decomposition of titanium halides and alkyl silicates, and (3) control of reflectance/antireflectance by the number and sequence of films of different refractive indices. The methods described involve merely the reaction of the starting materials as opposed to polymer growth. Moulton et al had no concept of polymerization and the subsequent effect on refractive index. An attempt was made to prepare lower refractive index $SiO_2$ films by the addition of $MgCl_2$ to an alkyl silicate solution, followed by the selective leaching of Mg (a process analogous to current methods using etching of biphasic films to lower the refractive index by increasing porosity).

U.S. Pat. No. 4,286,024 to Yoldas describes methods of obtaining high temperature resistant aluminosilicate monoliths and protective films for quartz and alumina substrates. The methods described require treatment at very high temperatures (1200° C.–1400° C.) specifically to eliminate porosity in the monolith/film. These methods are unsuitable for coating plastic substrates which have a maximum temperature of 150° C.

U.S. Pat. No. 4,361,598 to Yoldas describes the use of sol-gel techniques to deposit dense antireflective $SiO_2$/$TiO_2$ films onto solar cells and stainless steel or silicon ribbon. The refractive index range attainable using mixtures of these solutions is 1.4–2.4. The refractive index required for AR film formation on plastics is $\sim 1.22$ and cannot be achieved using the methods of Yoldas without the introduction of porosity. In addition, Yoldas' method requires heat treatments considerably higher than the upper temperature limits of plastics. Refractive index control is achieved by composition, firing temperature (300° C.–600° C.) and firing atmosphere. In contrast, the present invention achieves refractive index control totally in solution in order to deposit a film with an index of $\sim 1.22$ and which requires no heat treatment.

U.S. Pat. No. 4,397,666 to Mishima et al primarily describes a method for depositing thick sol-gel derived films by using "viscosity adjusting agents". The refractive index of these films is not addressed and films obtained using this method range from 0.3 $\mu m$–1.0 $\mu m$ thick. Such thicknesses are considerably greater than the 0.123 $\mu m$ thick film specified by Fresnel's equations for AR film formation on plastics.

SUMMARY OF THE INVENTION

Therefore, it is an object of the present invention to provide an antireflective surface coating process for plastics, via microstructure tailoring of a sol-gel solution which will overcome the above noted disadvantages.

Another object of the present invention is to provide a method for the preparation of an antireflective surface coating solution.

A further object of the present invention is to provide an antireflective surface film for coating plastic substrates.

Yet another object of the present invention is to provide a method for coating a plastic substrate with an antireflective surface film to form an article.

Still a further object of the present invention is to provide an article comprising a plastic substrate having an antireflective surface film coated thereon, which is useful in solar thermal and solar photovoltaic applications.

To achieve the foregoing and other objects, and in accordance with the purpose of the present invention, as embodied and broadly described herein, there is provided a sol-gel antireflective surface coating solution, a coating film derived therefrom, a plastic substrate coated with the coating film and methods for their preparation. The sol-gel antireflective surface coating film in accordance with the present invention is simple and inexpensive. More particularly, the antireflective surface coating film comprises a single layer, sol-gel interference silicon and/or metal alkoxide polymeric film, which does not need to be heat treated to a high temperature and/or etched after being coated onto a plastic substrate.

Additional objects, advantages, and novel features of this invention will become apparent to those skilled in the art upon examination of the following detailed description or may be learned in the practice of the invention. The objects and advantages of the invention may be realized and attained by means of the instrumentalities and combinations particularly pointed out in the appended claims.

BRIEF DESCRIPTION OF THE DRAWINGS

The accompanying figures, which are incorporated in and form part of the specification, illustrate an embodiment of the present invention and, together with the description, serve to explain the principles of the invention. However, these figures, as well as the following detailed description and examples, are given by way of illustration only and thus are not limitative of the present invention.

FIG. 1 shows reflectance spectra for an uncoated acrylic substrate and an acrylic substrate that has been coated with a sol-gel single layer antireflective film. The reflectance of acrylic at 660 nm is reduced from 0.074 for the uncoated substrate to 0.005 for the single layer AR coated material. The sol-gel coated material exhibits the discrete minimum reflectance that is characteristic of single layer interference films.

FIG. 2 shows reflectance spectra for an uncoated polycarbonate substrate and a polycarbonate substrate that has been coated with a sol-gel single layer antireflective film. The reflectance of polycarbonate at 660 nm is reduced from 0.092 for the uncoated substrate to <0.005 for the single layer AR coated material. In both FIGS. 1 and 2, reflectance becomes irregular in the near-infrared wavelengths beyond 1000 nm due to absorption by the plastic substrates.

DETAILED DESCRIPTION OF THE INVENTION

Figure 1:
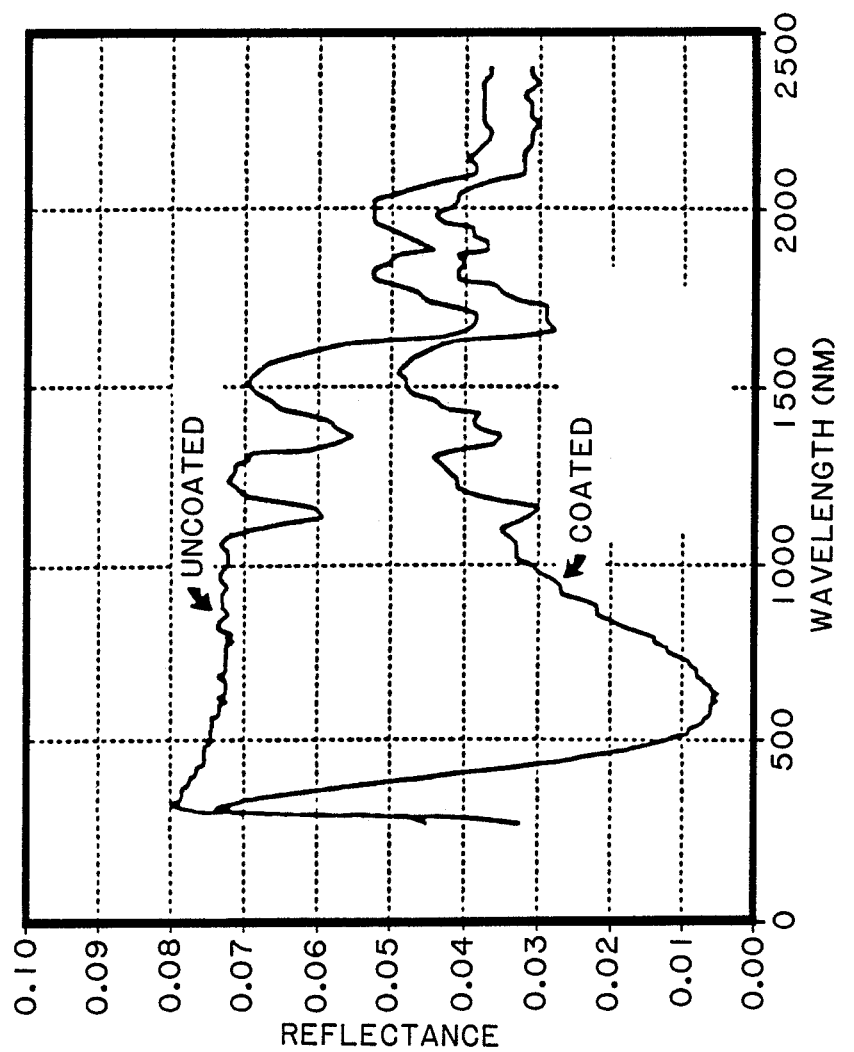
FIGS. 1 and 2 show reflectance (from 0.0 to 0.1 reflectance units) versus wavelength measured from 260–2400 nm. Optical measurements of reflectance or transmittance are made using a Beckman 5270 spectrophotometer equipped with an integrating sphere.

According to the present invention, there is provided a method for the application of a porous glass film on a plastic substrate (a single layer antireflecting film from a multicomponent oxide glass), a method for reliquifying a gelled solution and using the resulting solution, a method for tailoring the growth of polymers in solution in order to deposit a low index sol-gel film that does not require heating or etching, and a method for altering the surface chemistry of the plastic from being hydrophilic by depositing a porous glass on its surface.

Sol-gel (shortened from solution-gelation) is a process which uses silicon and/or metal alkoxides $M(OR)_x$, as oxide glass pressure where M=Si, Ti, B, Al, Zr or other ceramic types of metals; R is an alkyl group, usually having 1–4 carbon atoms; and x is equal to the valence state of the cation, M. Silicon and/or metal alkoxides, when mixed with water and a catalyst in an alcohol solution, undergo hydrolysis and condensation reactions to form a polymeric network. The polymer, which continues to cross-link until a gel is formed, expels its solvent, and upon heating, densifies to form a glass. Thin glass coatings can easily be applied using sol-gel technology. Processing temperatures to form a glass by sol-gel techniques are much lower than conventional glass formation via melting of metal oxides.

Solar average transmittance values for various plastics and glasses are determined by measuring the transmittance, T, as a function of wavelength, $\lambda$, from 260 nm to 2400 nm. These data are then averaged over the appropriate solar spectral distribution to obtain the solar averaged value. In a solar thermal system, the appropriate spectrum is the solar energy spectrum, $S_E$, usually reported as watts/cm²/nm. The solar energy average transmittance, $T_E$, is then calculated. In photovoltaic collectors, the appropriate average utilizes a solar photon spectrum, $S_p$, which is usually reported as photons/cm²/sec. The solar photon averaged transmittance, $T_p$, is then calculated. For example, 0.25" thick acrylic has a $T_E$ value of 0.85 (85% transmission), while the $T_p$ value is 0.91 (91% transmission). Using this antireflecting sol-gel coating on acrylic increases $T_E$ to 0.90 and $T_p$ to 0.96–0.98 (depending on weighting factor).

Definitions of the various terms pertaining to the description of the present invention are set out below.

Solar energy average transmission, $T_E$, is defined as an average of the spectral transmittance measured from 260 nm to 2400 nm using a solar energy spectrum, $S_E$, as the weighting factor and calculated using the equation:

$$T_E = \frac{\int_{260}^{2400} T(\lambda) S_E(\lambda) d\lambda}{\int_{260}^{2400} S_E(\lambda) d\lambda}$$

(Recommended curves for $S_E$ are given in reference by M. A. Lind et al, "The Sensitivity of Solar Transmittance, Reflectance and Absorptance to Selected Averaging Procedures and Solar Irradiance Distributions", *Journal of Solar Energy Engineering*, Vol. 102, Feb. 1980, pp. 34–40).

Solar photon average transmission, $T_p$, is defined as an average of the spectral transmittance using a solar photon spectrum, $S_p$, as the weighting factor and calculated using the equation:

$$T_P = \frac{\int_{\lambda_1}^{\lambda_2} T(\lambda) S_P(\lambda) d\lambda}{\int_{\lambda_1}^{\lambda_2} S_P(\lambda) d\lambda}$$

The wavelength interval is determined by the type of solar cell used in the concentrator. For silicon cells, $\lambda_1 = 260$ nm, and $\lambda_2 = 1120$ nm, while for GaAs cells, $\lambda_1 = 250$ nm, and $\lambda_2 = 880$ nm. Additional information on the averaging procedure and transmittance results for a variety of materials is given in reference by R. B. Pettit, "Hemispherical Transmittance Properties of Solar Glazings as a Function of Averaging Procedure and Incident Angle", Solar Energy Materials, Volume 1, 1979, pp. 125–140.

To antireflect means to reduce the reflectance of a material to a value below that of the intrinsic material.

Index of Refraction is defined as the ratio of the speed of light in the first of two media to that of the second as it passes from one into the other.

Reflectance, R, is defined as the ratio of the amount of reflected radiation from a material or surface to that of the incident radiation.

Transmittance, T, is defined as the ratio of the amount of transmitted radiation that passes through a material to that of the incident radiation.

Absorptance, A, is defined as the ratio of the amount of absorbed radiation within a material to that of the incident radiation. For the same measurement conditions, $R + T + A = 1.0$ (reflectance + transmittance + absorptance = total amount of incident light). Assumptions for the value A are: (1) absorptance is constant for materials of the same composition and thickness, and (2) contributions to absorptance by the sol-gel films are insignificant. As a result, any reduction in reflectance results in a corresponding increase in transmittance.

The sol-gel, antireflective surface coating solution of the present invention is comprised of a reliquified sol-gel hydrolyzation, condensation polymeric reaction product of a silicon alkoxide, a metal alkoxide or a mixture thereof. More particularly, the polymeric reaction product is formed from a reaction system which comprises a silicon alkoxide, a metal alkoxide or a mixture thereof mixed with water and a catalyst in an alcohol solution. The preferred metal alkoxides are represented by formula $M(OR)_x$, where M = Si, Ti, B, Al, Zr or other ceramic types of metals; R is an alkyl group, usually having 1–4 carbon atoms, and X is equal to the valence state of the cation, M. The most preferred polymeric reaction product is formed from monomeric alkoxides of tetraethoxysilane, aluminum-sec-butoxide, and trimethylborate in an alcohol solution also containing water and an acid catalyst.

In general, a sol-gel method involves the use of, e.g., silicon and/or metal alkoxides which hydrolyze and condense to form a polymeric solution (sol) from which a thin glass film can be deposited by spinning, spraying or dipping. The polymers in solution continue to increase in size and/or complexity until the solution forms a semirigid gel.

Studies of antireflecting films on Pyrex (Sandia Report SAND 84-0662) indicated that, as the polymers grew in the solution, the refractive index of a deposited film decreased progressively, due to the resulting film porosity increase. However, solution gelation occurred before the polymers were sufficiently large to produce the required low index when coating plastics. As a result, as described above, it was necessary to heat treat the film deposited onto Pyrex therefrom to a high temperature followed by etching of the heated film in order to adjust the deposited film to the refractive index and thickness required for solar thermal applications.

The method of the present invention for preparing a sol-gel antireflective surface coating solution comprises several characteristic features. A silicon alkoxide, metal alkoxide or a mixture thereof is subjected to hydrolyzation and condensation in a solution to form a sol-gel hydrolyzation, condensation polymeric reaction product. The gel formed from the sol is reliquified. The reliquification involves breaking of polymer-polymer bonds by means of ultrasonic agitation. The reliquified gel is then diluted to increase its stability and to form the sol-gel antireflective surface coating solution of the present invention. From this solution, a film with the required low index of refraction can be deposited on a plastic substrate which does not require heating or etching. This reliquified gel contains large polymers in solution resulting in a deposited film with greater porosity, and hence a lower refractive index. By careful control of the coating rate, the optimum film thickness can be obtained. The preferred plastic substrates are acrylic polymers and polycarbonates.

The antireflective surface coating film of the present invention is formed from a sol-gel antireflective surface coating solution comprising a reliquified sol-gel hydrolyzation, condensation polymeric reaction product of a silicon alkoxide, a metal alkoxide or a mixture thereof. The film is particularly useful for coating plastic substrates in that the deposited film acquires the refractive index and thickness necessary for solar thermal applications without having to heat treat the deposited film at a high temperature followed by an etching step.

The article of the present invention comprises a plastic substrate having the aforementioned film deposited thereon. The preferred plastic substrates are acrylic polymers and polycarbonates.

The method of the present invention for coating a plastic substrate with the aforementioned film comprises applying to the surface of a plastic substrate a sol-gel antireflective surface coating solution comprising a reliquified sol-gel hydrolyzation, condensation polymeric reaction product of a silicon alkoxide, a metal alkoxide or a mixture thereof to deposit a film onto the substrate. The deposited film is preferably dried at a temperature from about 50° C. to 100° C.

The developed coating procedure of the present invention is a simple and inexpensive process compared to prior techniques since it eliminates the need for expensive evaporators or plasma equipment. The formulating, aging, and reliquifying of a sol-gel does not require complex or expensive equipment. Simple film application techniques, including spinning or dipping, permit the coating of large complicated shapes, and even simultaneous coating of the inner and outer surfaces of a tube. The large scale application of a sol-gel antireflecting surface coating film is possible without a limit on the size of the part to be coated. There are many sol-gel antireflecting surface coating films applied to vitreous substrates. However, the process of the present invention is the first process which eliminates the necessity to heat and/or etch the sol-gel antireflective surface coating film to produce a porous, low index, antireflecting glassy film. In addition, the application of a porous glass film onto plastic changes the surface chemistry from hydrophobic to hydrophilic thus eliminating water spotting on the plastic from rain or rinsing (see Table 1).

TABLE 1

| Wetting Angle of Deionized Water Measured Using an Optical Comparitor | | |
|---|---|---|
| | Acrylic | Polycarbonate |
| Uncoated Plastic | 60° | 75° |
| Fresh Sol-Gel AR Coat on Plastic | 24° | 26° |
| Sol-Gel AR on Plastic Outside 6 Months | 17° | 23° |

Figure 2:
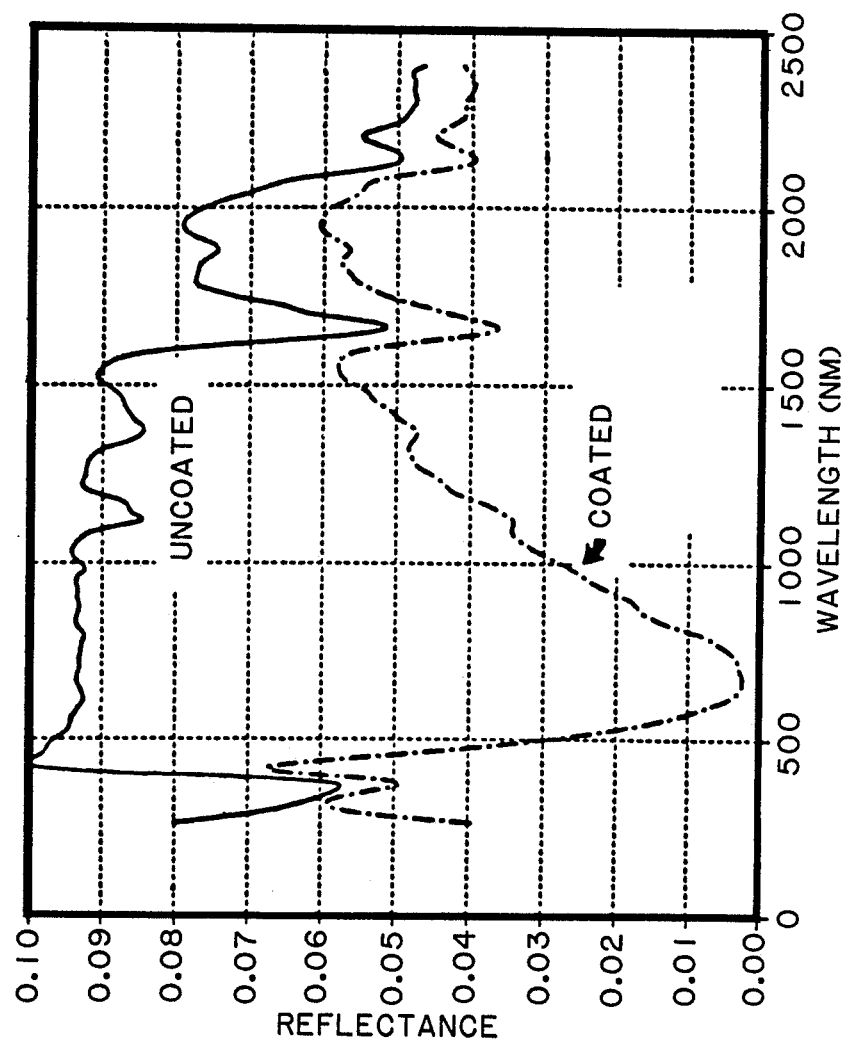

The present invention deposits a single layer, sol-gel interference film which has a well controlled thickness and refractive index, thereby exhibiting minimum reflectance at a predetermined wavelength. (See FIGS. 1 and 2.)

PREFERRED EMBODIMENTS

The present invention having been generally described, the following examples are given as particular embodiments of the present invention, to illustrate some of the properties and demonstrate the practical advantages thereof, and to allow one skilled in the art to utilize the present invention to its fullest extent. It is understood that these examples are to be construed as merely illustrative, and not limitative of the remainder of the disclosure or the claims in any way whatsoever.

EXAMPLE I

The general range of sol-gel compositions (weight percent oxides) is 65–81 $SiO_2$, 16–20 $B_2O_3$, 3–10 $Al_2O_3$, 0–5 $BaO$.

The preparation of a preferred composition 71 $SiO_2$, 18 $B_2O_3$, 7 $Al_2O_3$, 4 $BaO$ is made as follows (multiples of volumes are possible):

1. In an air tight reaction flask equipped with a stirring mechanism and water-cooled condenser mix:
   122 ml ethanol (absolute)
   122 ml tetraethoxysilane (TEOS)
   0.4 ml 1M HCL
   9.6 ml deionized water
   Stir 1.5 hour at 60° C. then cool to 40° C.
2. Dissolve 17.4 g aluminum-sec-butoxide in 18 ml isopropyl alcohol, add to TEOS/alcohol mixture of #1 above. Stir 10 min at 40° C.; add 4.4 ml deionized water. Stir 10 min at 40° C.
3. Add 26.9 ml trimethylborate. Stir 1 hour at 40° C. then cool to 25° C.
4. At 25° C., add in sequence:
   25.8 ml $H_2O$
   8 ml concentrated glacial acetic acid
   25.8 ml $H_2O$
   10.8 ml 1M barium acetate
   Stir 15 min at 25° C.
5. Dilute 1 part sol-gel with 4 parts absolute ethanol. Care should be taken to avoid exposure of the undiluted solution to air. The final volume of diluted solution is approximately 2 liters and contains approximately 2.9 wt % oxides.

The solution is transferred into glass bottles and aged at about 50° C. for 2–3 weeks. This elevated temperature increases the rate of polymerization in the solution and leads to gelation. Aging longer than 3 weeks leads to excessive crosslinking of the polymers, thus requiring extended ultrasonic agitation resulting in non-homogeneous solutions. It is preferable to age the sols in either an explosion proof oven or one with adequate ventilation to prevent any possible explosion if alcohol vapors should escape from the bottles. The bottles are then transferred to an ultrasonic water bath and alternately agitated for 5 minutes, and then shaken, until the gel is liquified (typically from 20 to 40 minutes). The liquified gel is then diluted with an equal volume of ethanol for stability and to improve its coating characteristics. Without dilution, the viscosity of the liquified gel increases noticeably within a few days at room temperature and eventually re-gels.

EXAMPLE II

Any protective film on the plastic must first be removed. The plastic is then degreased in a suitable solvent such as trichloroethylene, freon TF, or other non-reactive solvent. It is next cleaned in a detergent solution (e.g., 240 ml isopropanol, 60 ml deionized water, 0.6 ml Renex TM 690, and 0.15 ml Span TM 80), rinsed successively with deionized water and ethanol, followed by drying under a heat lamp at approximately 50° C. If the plastic has spotted it should be blown dry following the ethanol rinse with clean dry nitrogen or argon (compressed air with possible oil contamination should be avoided).

The plastic is coated with the solution of Example I.

Typical coating rates range from 0.5 to 12 inches per minute depending upon the solution viscosity and temperature. After coating and air drying, the sol-gel coated plastic should be further dried under a heat lamp (about 50° C. –100° C.). At this point the plastic surface should have a deep blue tint typical of a single layer antireflecting sol-gel film with a reflectance minimum at 600 nm. If the color is purple, the film is too thin and the coating rate should be increased slightly. If the color is a pale blue, the film is too thick and the coating rate should be decreased. This subjective color determination of thickness is a result of observations of film appearance after reflectance measurements using a Beckman spectrophotometer.

From the foregoing description, one skilled in the art can easily ascertain the essential characteristics of this invention and, without departing from the spirit and scope thereof, can make various changes and modifications of this invention to adapt it to various usages and conditions. Such variations are not to be regarded as a departure from the spirit and scope of the present invention, and all such modifications as would be obvious to one skilled in the art are intended to be included within the scope of the following claims.

What is claimed is:

1. A method to form an antireflective film, comprising:
applying to a surface of a substrate a sol-gel antireflective surface coating solution, prepared by a method comprising the steps of:
  (a) subjecting a solution of a silicon alkoxide, a metal alkoxide, or a mixture thereof to hydrolyzation and condensation in a reaction system containing water and a catalyst in an alcohol solution;
  (b) aging said system to form a sol-gel hydrolyzation-condensation polymeric reaction product;
  (c) reliquifying the gel of said sol-gel reaction product by breaking the polymer-polymer bonds of said gel;
  (d) diluting said reliquified sol-gel reaction product to produce said sol-gel antireflective surface coating solution;
air drying said coated substrate; and
further drying said coated substrate under a heat lamp.

2. An antireflective film formed by the method of claim 1.

3. The method of claim 1, wherein said substrate is comprised of a plastic substrate.

4. A coated article formed by the method of claim 3.

5. The method of claim 1, wherein said aging step of said film forming method is for a period of 2 to 3 weeks at a temperature of about 50° C.

6. The method of claim 1, wherein said reliquifying step of said film forming method is carried out by ultrasonic agitation means.

7. The method of claim 1, wherein said solution is applied to said substrate by spinning.

8. The method of claim 1, wherein said solution is applied to said substrate by spraying.

9. The method of claim 1, wherein said solution is applied to said substrate by dipping.

10. The method of claim 1, wherein the alkoxide of said solution preparation method is represented by formula $M(OR)_x$, where M=Si, Ti, B, Al, Zr, or other metals which form a ceramic upon oxidation; R is an alkyl group having 1–4 carbon atoms; and x is equal to the valence state of the cation, M.

11. The method of claim 1, wherein said further drying step is performed at a temperature from about 50° C. to 100° C.

12. The method of claim 3, wherein said plastic substrate is comprised of an acrylic polymer.

13. The method of claim 3, wherein said plastic is comprised of a polycarbonate.

14. The method of claim 1, wherein the reliquified sol-gel, hydrolyzation-condensation, polymeric reaction product of said solution preparation method is a product of tetraethoxysilane, aluminum-sec-butoxide, and trimethylborate.

* * * * *